US010891185B2

(12) United States Patent
Warnes et al.

(10) Patent No.: US 10,891,185 B2
(45) Date of Patent: Jan. 12, 2021

(54) ERROR COUNTERS ON A MEMORY DEVICE

(71) Applicant: HEWLETT PACKARD ENTERPRISE DEVELOPMENT LP, Houston, TX (US)

(72) Inventors: Lidia Warnes, Roseville, CA (US); Melvin K. Benedict, Magnolia, TX (US); Andrew C. Walton, Rocklin, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 446 days.

(21) Appl. No.: 15/314,831

(22) PCT Filed: Aug. 8, 2014

(86) PCT No.: PCT/US2014/050406
§ 371 (c)(1),
(2) Date: Nov. 29, 2016

(87) PCT Pub. No.: WO2016/022156
PCT Pub. Date: Feb. 11, 2016

(65) Prior Publication Data
US 2017/0192843 A1 Jul. 6, 2017

(51) Int. Cl.
*G11C 29/06* (2006.01)
*G06F 11/10* (2006.01)
(Continued)

(52) U.S. Cl.
CPC .......... *G06F 11/1044* (2013.01); *G06F 5/065* (2013.01); *G06F 11/076* (2013.01);
(Continued)

(58) Field of Classification Search
CPC .... G06F 11/1044; G06F 11/076; G06F 5/065; G11C 29/44; G11C 29/50004; G11C 2029/5004
See application file for complete search history.

(56) References Cited

U.S. PATENT DOCUMENTS 7,334,159 B1 * 2/2008 Callaghan ........... G06F 12/1408
365/200
8,601,330 B2 12/2013 Jeong et al.
(Continued)

OTHER PUBLICATIONS

Greenberg, M., Achieve Reliability, Availability, and Serviceability for Memory Interfaces, (Web Page), Feb. 25, 2014, 7 Pages.
(Continued)

*Primary Examiner* — Mohammed A Bashar
(74) *Attorney, Agent, or Firm* — Hewlett Packard Enterprise Patent Department

(57) ABSTRACT

Example implementations relate to tracking memory unit errors on a memory device. In example implementations, a memory device may include on-die error-correcting code (ECC) and a plurality of error counters. One of the plurality of error counters may count errors, detected by the on-die ECC, in a memory unit on the memory device. A post package repair (PPR) may be initiated on the memory device in response to a determination that a value of the one of the plurality of error counters equals a threshold value.

12 Claims, 7 Drawing Sheets

(51) Int. Cl.
  *G11C 29/44* (2006.01)
  *G11C 29/50* (2006.01)
  *G11C 29/12* (2006.01)
  *G06F 5/06* (2006.01)
  *G06F 11/07* (2006.01)
  *G11C 11/41* (2006.01)

(52) U.S. Cl.
  CPC ........ *G11C 29/06* (2013.01); *G11C 29/12005* (2013.01); *G11C 29/44* (2013.01); *G11C 29/50* (2013.01); *G11C 29/50004* (2013.01); *G11C 11/41* (2013.01); *G11C 2029/5004* (2013.01)

(56) References Cited

U.S. PATENT DOCUMENTS

| | | |
|---|---|---|
| 2007/0250756 A1 | 10/2007 | Gower et al. |
| 2008/0055989 A1* | 3/2008 | Lee .................. G06F 11/1068 365/185.09 |
| 2010/0005376 A1 | 1/2010 | Laberge et al. |
| 2010/0058144 A1 | 3/2010 | Rohleder et al. |
| 2012/0221924 A1 | 8/2012 | Dlynn et al. |
| 2012/0267791 A1 | 10/2012 | Lee et al. |
| 2013/0235644 A1* | 9/2013 | Chung .................. G11C 17/16 365/103 |
| 2014/0078842 A1* | 3/2014 | Oh ...................... G11C 29/785 365/200 |
| 2015/0162099 A1* | 6/2015 | Jeong .................. G11C 29/42 714/719 |

OTHER PUBLICATIONS

International Searching Authority, The International Search Report and the Written Opinion, dated Apr. 6, 2015, 13 Pages.

Kim, M., Evolutionary Migration from LPDDR3 to LPDDR4, (Research Paper), Jan. 2, 2014, 23 Pages.

Lee, Y-S. et al., An Efficient Self Post Package Repair Algorithm and Implementation in Memory System with On-chip-EGG, (Research Paper), Nov. 13-15, 2006, 1 Page.

\* cited by examiner

ERROR COUNTERS ON A MEMORY DEVICE

BACKGROUND

A memory module may have multiple memory devices. Error correction logic may be used to correct errors detected in memory devices. A memory module may include extra memory elements so that when memory elements of a memory device on the memory module malfunction, extra memory elements may be used instead of the entire memory module having to be replaced.

BRIEF DESCRIPTION OF THE DRAWINGS

The following detailed description references the drawings, wherein.

DETAILED DESCRIPTION

Memory elements on memory devices may fail to properly store data, for example as a result of a manufacturing defect or due to environmental conditions as memory devices are used. As used herein, the term "memory element" should be understood to refer to a portion of a memory device that can be addressed by a processor. A manufacturer of memory modules may fabricate redundant memory elements that may be used to replace defective memory elements on memory devices. Such redundant memory elements may be referred to herein as "repair units". Repair units may include, for example, spare rows, spare columns, and/or spare single memory elements. The process of replacing a defective memory element or elements with a repair unit after a memory device is packaged may be referred to herein as "post package repair", or "PPR".

Some memory modules may include memory devices that have on-die error-correcting code (ECC), which may allow errors in a memory device to be detected and, in some cases, corrected without involvement of a memory controller external to the memory module. For example, volatile memory devices, such as double data rate fourth generation synchronous dynamic random-access memory (DDR4 SDRAM), that have on-die ECC may detect errors in an SDRAM chip without involvement from an external memory controller. Although on-die ECC may increase reliability of a memory device, system-level reliability may be decreased because on-die ECC may hide some errors, diminishing a memory controller's ability to detect a memory location that fails frequently and to restore system health using PPR before a system crash. In addition, resources on a memory controller may be expended to track detected errors in various regions of a memory module. Furthermore, even if a PPR occurs on a memory device to prevent a system crash, the PPR may render the memory device unavailable to the rest of the system, causing operating system (OS) and/or application timeouts.

In light of the above, the present disclosure provides for on-die tracking of errors detected by on-die ECC. For example, counters on a volatile memory device may keep track of errors detected in each row of the volatile memory device, which may free resources on a memory controller that would otherwise be used to store addresses of memory locations where errors are detected. Additionally, the present disclosure enables reading from and writing to a memory device that is undergoing PPR, decreasing OS and application timeouts.

Figure 1:
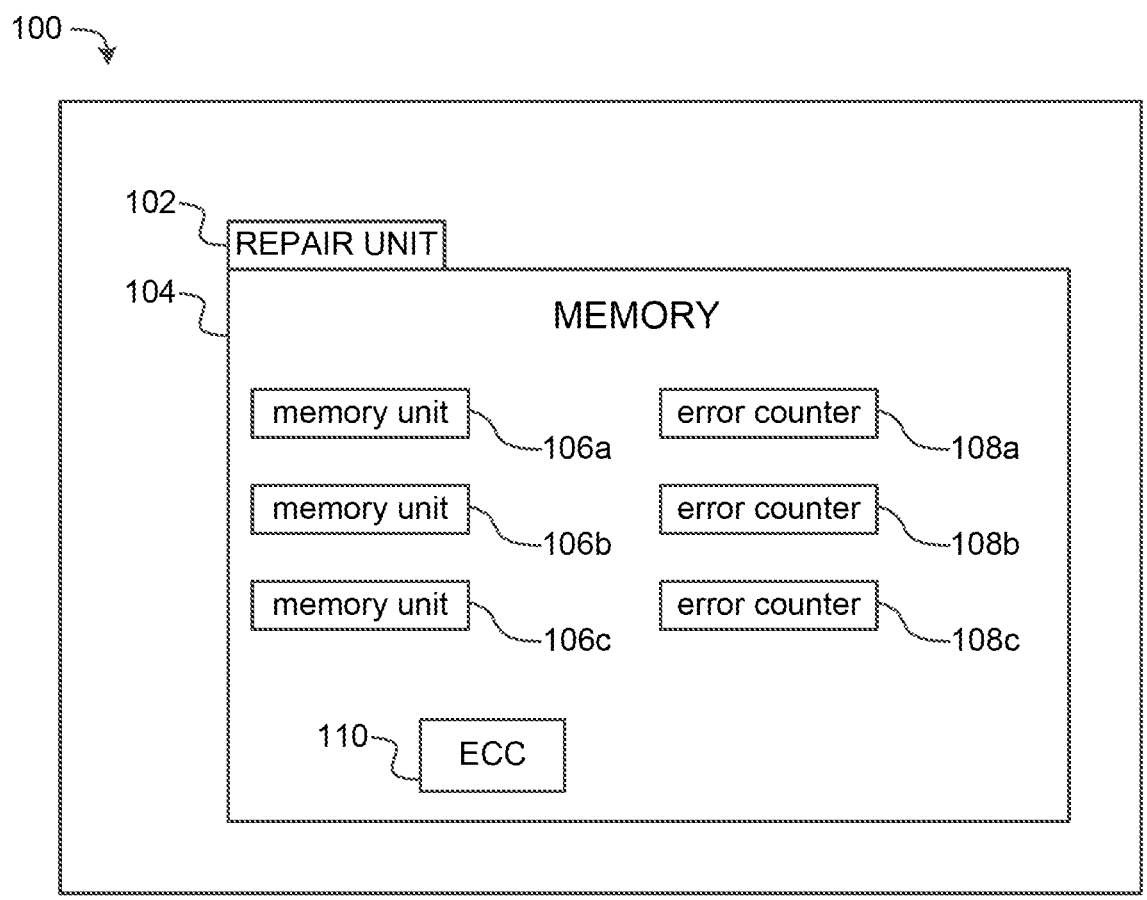
FIG. 1 is a block diagram of an example memory module that includes error counters.

Referring now to the figures, FIG. 1 is a block diagram of an example memory module 100 that includes error counters. Memory module 100 may be an in-line memory module, such as a single in-line memory module (SIMM) or a dual in-line memory module (DIMM), or any memory module suitable for mounting memory integrated circuits (ICs). In FIG. 1, memory module 100 includes repair unit 102; memory device 104; memory units 106*a*, 106*b*, and 106*c*; error counters 108*a*, 108*b*, and 108*c*; and on-die error-correcting code (ECC) 110. As used herein, the terms "include", "have", and "comprise" are interchangeable and should be understood to have the same meaning.

Memory device 104 may be on an IC on memory module 100. In some implementations, memory device 104 may be a volatile memory device, such as a dynamic random-access memory (DRAM) device. In some implementations, memory device 104 may be a non-volatile memory device (e.g. flash memory). Although one memory device is shown in FIG. 1, it should be understood that memory module 100 may include multiple memory devices similar to memory device 104, and that the concepts discussed herein may be applicable to a memory module having any number of memory devices.

Memory device 104 may include memory units 106*a-c* and error counters 108*a-c*. Each of memory units 106*a-c* may be, for example, a row of memory elements or a column of memory elements. Each of error counters 108*a*, 108*b*, and 108*c* may count errors, detected by on-die ECC 110, in a respective memory unit dh memory device 104. For example, error counter 108*a* may count errors, detected by on-die ECC 110, in memory unit 106*a*. Error counter 108*a* may be incremented every time on-die ECC 110 detects an error in memory unit 106*a*. Similarly, error counters 108*b* and 108*c* may count errors, detected by on-die ECC 110, in memory units 106*b* and 106*c* respectively. On-die ECC 110 may detect errors in memory units on memory device 104 without assistance from a memory controller external to memory module 100.

Repair unit 102 on memory module 100 may be used to replace defective portions of a memory device during a PPR. In some implementations, repair unit 102 may be used to replace any of the memory units (e.g., memory units 106*a*, 106*b*, and 106*c*) on memory device 104. In some implementations, repair unit 102 may be embedded in memory device 104. Although one repair unit is shown in FIG. 1, it should be understood that memory module 100 may include multiple repair units, and that the concepts discussed herein may be applicable to a memory module having any number of repair units.

A PPR may be initiated on memory device 104 in response to a determination that a value of the one of error counters 108*a-c* equals a threshold value. For example, the threshold value may be equal to five, and a PPR may be initiated on memory device 104 when the value of error counter 108*a*, which may count errors detected in memory unit 106*a*, is equal to five (e.g., when on-die ECC 110 has detected five errors in memory unit 106*a*), The PPR may replace memory unit 106*a* with repair unit 102. During the PPR, data in memory unit 106*a* may be copied to repair unit 102. Although the present disclosure discusses initiating a PPR in response to an error counter value being equal to a threshold value, it should be understood that a PPR may be initiated in response to an error counter value exceeding a threshold value, and that the concepts discussed herein may be applicable to situations where a PPR is initiated in response to an error counter value exceeding a threshold value. Although three memory units are shown in FIG. 1, it should be understood that memory module 100 may include more memory units or less memory units, and that the concepts discussed herein may be applicable to a memory module having any number of memory units. In addition, although three error counters are shown in FIG. 1, it should be understood that memory module 100 may include more error counters or less error counters, and that the concepts discussed herein may be applicable to a memory module having any number of error counters.

In some implementations, each of the plurality of error counters on a memory dev e may be associated with a respective one of a plurality of memory units on the memory device. For example, each of error counters 108*a-c* on memory device 104 may be associated with a respective one of memory units 106*a-c*, and may count errors detected in the respective memory unit (e.g., an error counter may be incremented in response to on-die ECC 110 detecting an error in the memory unit associated with the error counter). In such implementations, the number of error counters on the memory device may be equal to the number of memory units on the memory device, and each error counter may be implemented as a logic block among other logic blocks (e.g., sense amplifiers used during read/write operations) associated with the respective memory unit. In some implementations, the number of error counters on a memory device may be less than the number of memory units on the memory device, as discussed further with respect to FIG. 2.

Figure 2:
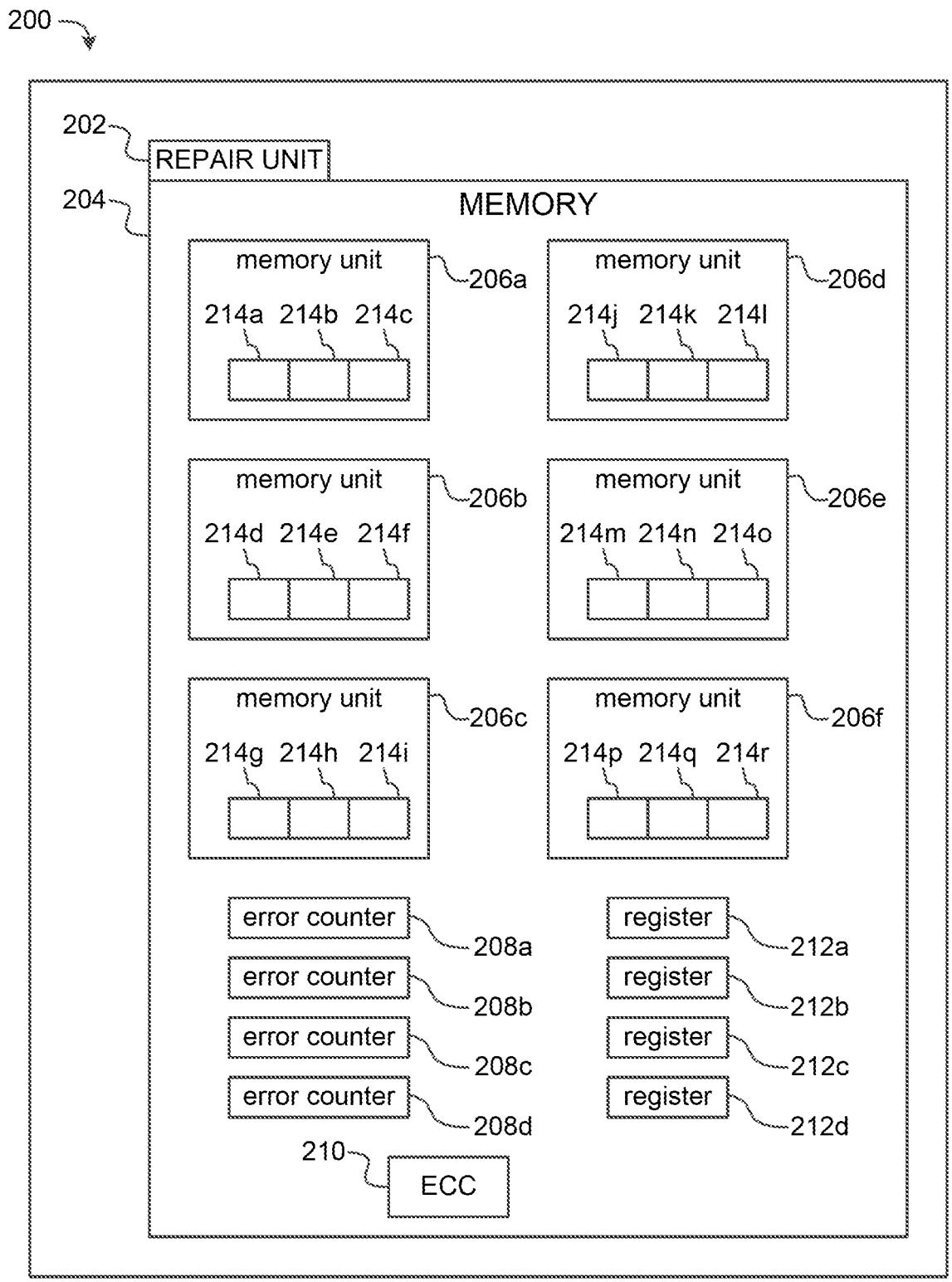
FIG. 2 is a block diagram of an example memory module that includes registers for storing memory addresses.

FIG. 2 is a block diagram of an example memory module 200 that includes registers for storing memory addresses. Memory module 200 may be an in-line memory module, such as a SIMM or DIMM, or any memory module suitable for mounting memory ICs. In FIG. 2, memory module 200 includes repair unit 202; memory device 204; memory units 206*a*, 206*b*, 206*c*, 206*d*, 206*e*, and 206*f*, error counters 208*a*, 208*b*, 208*c*, and 208*d*: registers 212*a*, 212*b*, 212*c*, and 212*d*, and on-die ECC 210. Repair unit 202 and on-die ECC 210 in FIG. 2 may be analogous to (e.g., have functions and/or components similar to) repair unit 102 and on-die ECC 110, respectively, in FIG. 1.

Memory device 204 may be on an IC on memory module 200. In some implementations, memory device 204 may be a volatile memory device, such as a DRAM device. In some implementations, memory device 204 may be a non-volatile memory device. Each of memory units 206*a-f* on memory device 204 may include a plurality of memory elements. For example, memory unit 206*a* may include memory elements 214*a*, 214*b*, and 214*c*. Memory unit 206*b* may include memory elements 214*d*, 214*e*, and 214*f*. Memory unit 206*c* may include memory elements 214*g*, 214*h*, and 214*i*. Memory unit 206*d* may include memory elements 214*j*, 214*k*, and 214*l*. Memory unit 206*e* may include memory elements 214*m*, 214*n*, and 214*o*. Memory unit 208*f* may include memory elements 214*p*, 214*q*, and 214*r*, Although three memory elements are shown in each of memory units 206*a-f*, it should be understood that each memory unit on memory device 204 may include more memory elements or less memory elements, and that the concepts discussed herein may be applicable to memory units having any number of memory elements. Each of memory units 206*a-f* may be, for example, a row of memory elements or a column of memory elements.

Error counters 208*a-d* may count errors, detected by on-die ECC 210, in the memory units on memory device 204. Any of error counters 208*a-d* may be capable of counting errors, detected by on-die ECC 210, in any of memory units 206*a-f*. Each of error counters 208*a-d* may be associated with a respective one of registers 212*a-d*. For example, error counter 208*a* may be associated with register 212*a*. A register on memory device 204 may store a memory address that is common to a plurality of memory elements in a memory unit to which the register's associated error counter is assigned. For example, error counter 208*a* may be assigned to memory unit 206*b*, which may be a row of memory device 204, and register 212*a* may store a row address that is, common to memory elements 214*d-f* (e.g., since memory elements 214*d-f* are all in the same row, they may all have the same row address but have different column addresses). An error counter that is assigned to a memory unit will track the number of errors that on-die ECC has detected in the memory unit since the assignment of the error counter to the memory unit (e.g., the error counter may be incremented in response to on-die ECC detecting an error in the memory unit). An error counter that has been assigned to a memory unit may be said to be "associated with" the memory unit.

An error counter on memory device 204 that is assigned to a first memory unit may be reset and made available for reassignment to a second (i.e., different) memory unit if no errors are detected in the first memory unit for a predetermined length of time. The reassignment may occur when the next error is detected in the second memory unit after the predetermined length of time has passed. For example, continuing with the example above, in response to a determination that on-die ECC 210 has not detected errors in memory unit 206*b* for a predetermined length of time (e.g., one second), error counter 208*a* may count errors, detected by on-die ECC 210, in memory unit 206*d*, and register 212*a* may store a memory address (e.g., row address) that is common to memory elements 214*m-o*. Error counter 208*a* may be reset (e.g., the value of error counter 208*a* may be set to zero), and register 212*a* may be cleared, before error counter 208*a* is reassigned to memory unit 206*d*.

In memory devices like memory device 204 that have less error counters than memory units, not every memory unit may have an assigned/associated error counter (i.e., an error counter that counts the number of errors that on-die ECC detects in the memory unit) at any given time. In some implementations, error counters 208*a-d* may be assigned to respective ones of memory units 206*a-f* in a first-in, first-out (FIFO) manner. For example, after boot-up processes have, been completed in memory module 200, the first, error detected by on-die ECC 210 may be in memory unit 206e, and error counter 208a may be assigned to memory unit 206e (e.g., error counter 208a may be incremented each time on-die ECC 210 detects an error in memory unit 206e). Register 212a, which may be associated with error counter 208a, may be programmed with a memory address that is common to the memory elements in memory unit 206e. The second memory unit in which on-die ECC 210 detects an error may be memory unit 206c, and error counter 208b may be assigned to memory unit 206c. Similarly, the third and fourth memory units in which on-die ECC 210 detects an error may be memory units 206a and 206f, respectively, and error counters 208c and 208d may be assigned to memory units 206a and 206f, respectively. Registers associated with the error counters that are assigned may store (e.g., be programmed with) the appropriate memory addresses. If on-die ECC 210 then detects an error in memory unit 206b, no error counter may be incremented because there are no error counters left to assign to memory unit 206b. However, if an amount of time greater than a threshold time (e.g., 100 ms) has passed since the last error was detected in one of the memory units that has an assigned error counter, the error counter assigned to that memory unit may be reset and reassigned to memory unit 206b, and the register associated with that error counter may be reprogrammed with a memory address (e.g., a column address, if memory unit 206b is a column) common to memory elements 214d-f. Because a PPR may replace an entire memory unit, a shorter address that is common to memory elements in a memory unit may be stored in a register rather than storing (longer) full addresses of each memory element in which an error is detected; such storage of a common address consumes less resources that storing individual memory element addresses.

Figure 3:
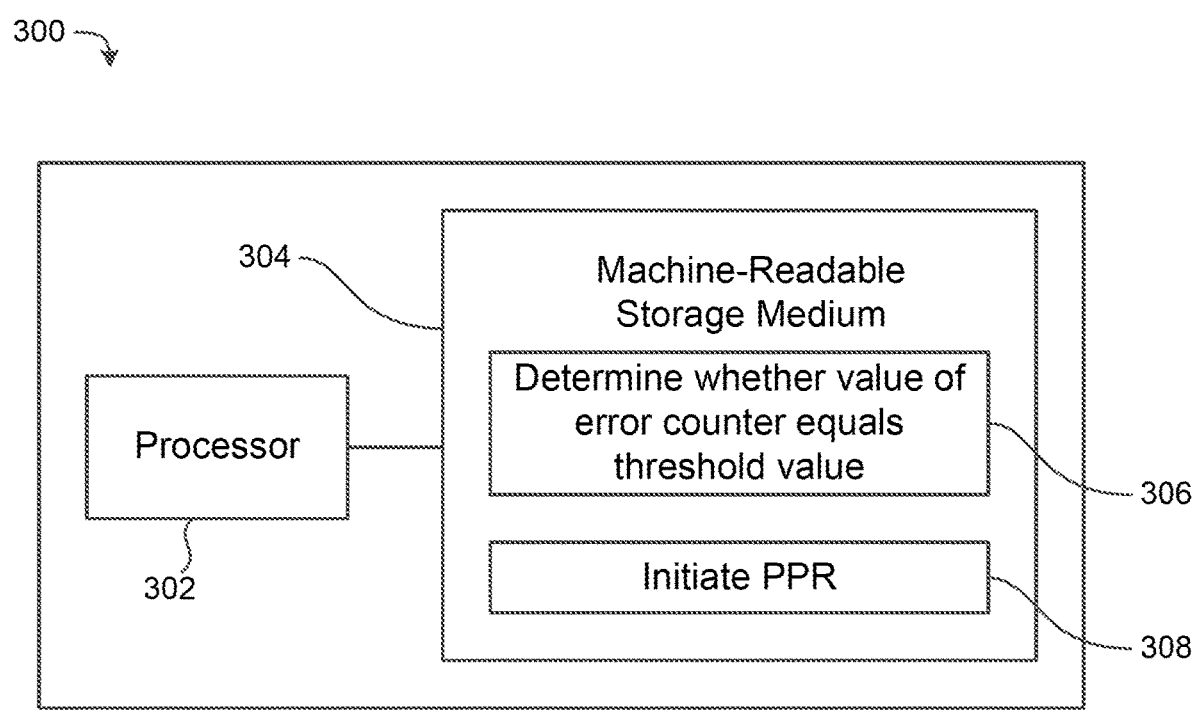
FIG. 3 is a block diagram of an example device that includes a machine-readable storage medium encoded with instructions to initiate a post package repair (PPR) in response to a determination that the value of an error counter equals a threshold value.

FIG. 3 is a block diagram of an example device 300 that includes a machine-readable storage medium encoded with instructions to initiate a PPR in response to a determination that the value of an error counter equals a threshold value. Device 300 may be a memory module (e.g., memory module 100 or 200) or a memory controller. In some implementations, device 300 may be part of an electronic user device, such as a notebook computer, a desktop computer, a workstation, a tablet computing device, a mobile phone, or an electronic book reader. In some implementations, device 300 may be part of a server. In FIG. 3, device 300 includes processor 302 and machine-readable storage medium 304.

Processor 302 may include a central processing unit (CPU), microprocessor (e.g., semiconductor-based microprocessor), and/or other hardware device suitable for retrieval and/or execution of instructions stored in machine-readable storage medium 304. Processor 302 may fetch, decode, and/or execute instructions 306 and 308. As an alternative or in addition to retrieving and/or executing instructions, processor 302 may include an electronic circuit comprising a number of electronic components for performing the functionality of instructions 306 and/or 308.

Machine-readable storage medium 304 may be any suitable electronic, magnetic, optical, or other physical storage device that contains or stores executable instructions. Thus, machine-readable storage medium 304 may include, for example, a random-access memory (RAM), an EEPROM, a storage device, an optical disc, and the like. In some implementations, machine-readable storage medium 304 may include a non-transitory storage medium, where the term "non-transitor" does not encompass transitory propagating signals. As described in detail below, machine-readable storage medium 304 may be encoded with a set of executable instructions 306 and 308.

Instructions 306 may determine whether a value of one of a plurality of error counters on a memory device equals a threshold value. For example, instructions 306 may determine whether a value of any of error counters 108a-c on memory device 104 or any of error counters 208a-d on memory device 204 equals a threshold value. The threshold value may be a predetermined value or a maximum value of an error counter. The Memory device may include on-die ECC. The one of the plurality of error counters may be associated with a memory unit on the memory device, and may be incremented in response to an error being detected, by the on-die ECC, in the memory unit.

Instructions 308 may initiate, in response to a determination that the value of the one of the plurality of error counters equals the threshold value, a PPR. The PPR may include replacing the memory unit with a repair unit. For example, a PPR that replaces memory unit 106b with repair unit 102 may be initiated in response to a determination that the value of error counter (e.g., error counter 108b) associated with memory unit 106b equals the threshold value. In some implementations, the PPR may be initiated by the memory device when the value of one of the error counters on the memory device equals the threshold value. In some implementations, the memory device may send a signal to a memory controller when an error counter on the memory device reaches the threshold value, and the memory controller may initiate a PPR on the memory device in response to receiving the signal. In some implementations, a Basic Input/Output System (BIOS) or other firmware stored as machine-readable instructions on a memory controller may periodically read values of error counters on the memory device, and may initiate a PPR (e.g., to replace a failed row) if a value of one of the error counters (e.g., an error counter that counts errors in the failed row) equals the threshold value.

Figure 4:
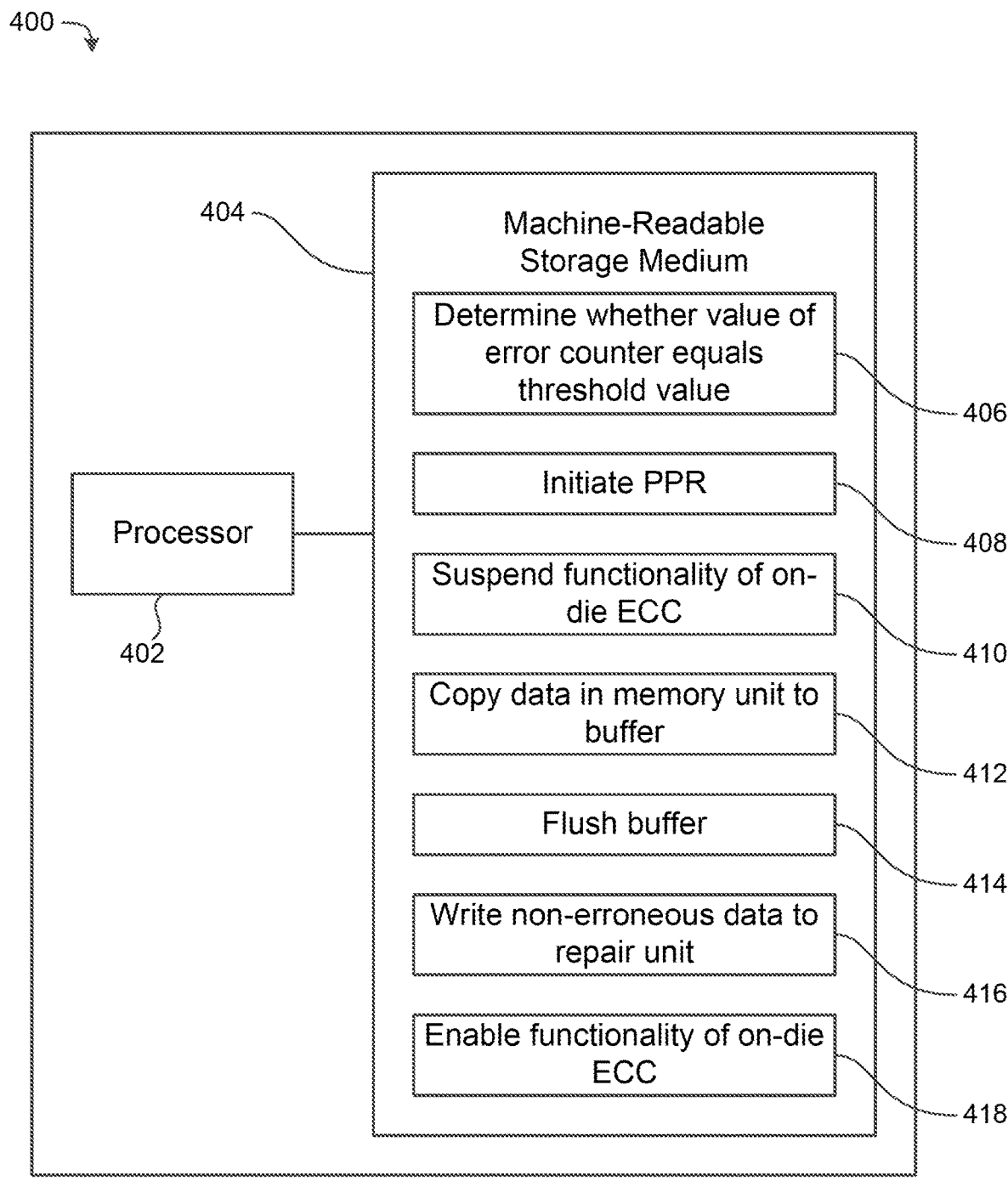
FIG. 4 is a block diagram of an example device that includes a machine-readable storage medium encoded with instructions to suspend functionality of on-die error-correcting code (ECC) during a PPR.

FIG. 4 is a block diagram of an example device 400 that includes a machine-readable storage medium encoded with instructions to suspend functionality of on-die ECC during a PPR. Device 400 may be a memory module (e.g., memory module 100 or 200) or a memory controller. In some implementations, device 400 may be part of an electronic user device, such as a notebook computer, a desktop computer, a workstation, a tablet computing device, mobile phone, or an electronic book reader. In some implementations, device 400 may be part of server. In FIG. 4, device 400 includes processor 402 and machine-readable storage medium 404.

As with processor 302 of FIG. 3, processor 402 may include a CPU, microprocessor (e.g., semiconductor-based microprocessor), and/or other hardware device suitable for retrieval and/or execution of instructions stored in machine-readable storage medium 404. Processor 402 may fetch, decode, and/or execute instructions 406, 408, 410, 412, 414, 416, and 418. As an alternative or in addition to retrieving and/or executing instructions, processor 402 may include an electronic circuit comprising a number of electronic components for performing the functionality of instructions 406, 408, 410, 412, 414, 416, and/or 418.

As with machine-readable storage medium 304 of FIG. 3, machine-readable storage medium 404 may be any suitable physical storage device that stores executable instructions. Instructions 406 and 408 on machine-readable storage medium 404 may be analogous to instructions 306 and 308 on machine-readable storage medium 304. Instructions 410 may suspend functionality of on-die ECC on a memory device during a PPR. The PPR may include replacing a memory unit on the memory device with a repair unit. While functionality of the on-die ECC is suspended, data read from the memory device may be transmitted to a memory controller, and ECC on the memory controller rather than the on-die ECC may be used to detect and correct errors in the data.

Instructions 412 may copy, during the PPR, data in the memory unit to a buffer on the memory device. The buffer r ay be used to hold data from the memory unit while the repair unit is fused in to replace the memory unit. The repair unit may contain no data (or junk data) as it is fused in (i.e., data in the memory unit may not be copied to the repair unit before or during the PPR). Neither on-die ECC nor ECC on a memory controller may be used to detect or correct errors in data that copied from the memory unit to the buffer, and thus the buffer may store erroneous data.

Instructions 414 may flush, after the PPR has been completed, data in the buffer to a memory controller. In some implementations, the buffer may be flushed in response to a signal indicating completion of the PPR. The memory controller may generate non-erroneous data by correcting erroneous data received from the buffer. For example, ECC on the memory controller may be used to correct erroneous data received from the buffer.

Instructions 416 may write the non-erroneous data to the repair unit. The repair unit may thus contain an error-free version of data that was in the (failed) memory unit. Read and write commands received during the PPR that are directed at addresses in the memory unit may not be executed until the non-erroneous data is written to the repair unit.

Instructions 418 may enable, in response to a determination that the write to the repair unit has been completed, functionality of the on-die ECC. In some implementations, functionality of the on-die ECC may be enabled in response to a signal indicating completion of the write to the repair unit. When functionality of the on-die ECC is enabled, on-die ECC may be used instead of ECC on a memory controller to detect/correct errors on the memory device, or use of ECC on a memory controller may be limited to instances where on-die ECC is unable to correct an error.

Figure 5:
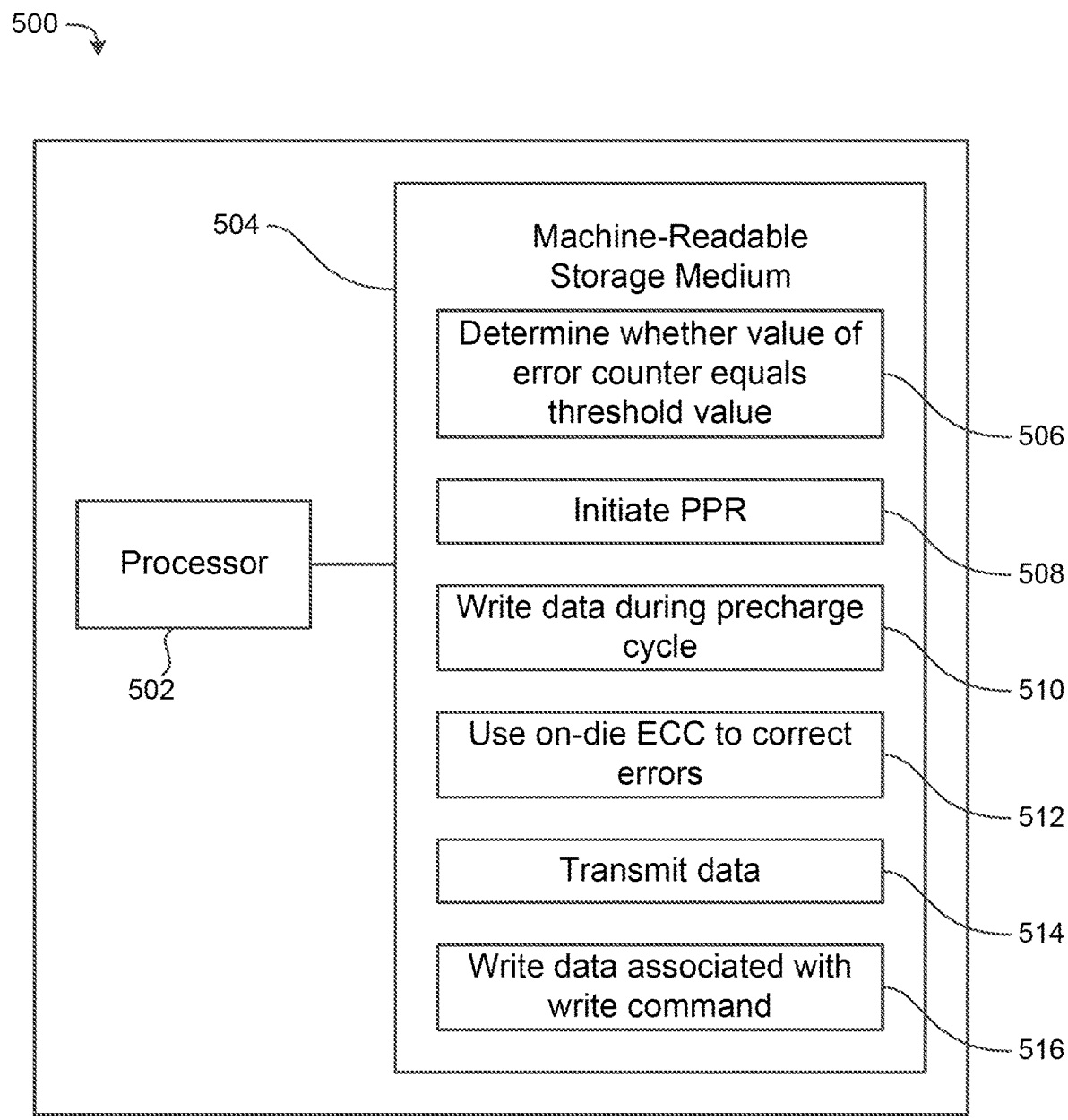
FIG. 5 is a block diagram of an example device that includes a machine-readable storage medium encoded with instructions to write data to a repair unit during a precharge cycle.

FIG. 5 is a block diagram of an example device 500 that includes a machine-readable storage medium encoded with instructions to write data to a repair unit during a precharge cycle. Device 500 may be a memory module (e.g., memory module 100 or 200). In some implementations, device 500 may be part of an electronic user device, such as a notebook computer, a desktop computer, a workstation, a tablet computing device, a mobile phone, or an electronic book reader. In some implementations, device 500 may be part of a server. In FIG. 5, device 500 includes processor 502 and machine-readable storage medium 504.

As with processor 302 of FIG. 3, processor 502 may include a CPU, microprocessor (e.g., semiconductor-based microprocessor), and/or other hardware device suitable for retrieval and/or execution of instructions stored in machine-readable storage medium 504. Processor 502 may fetch, decode, and/or execute instructions 508, 508, 510, 512, 514, and 518. As an alternative or in addition to retrieving and/or executing instructions, processor 502 may include an electronic circuit comprising a number of electronic components for performing the functionality of instructions 506, 508.510, 512, 514, and/or 516.

As with machine-readable storage medium 304 of FIG. 3, machine-readable storage medium 504 may be any suitable physical storage device that stores executable instructions. Instructions 506 and 508 on machine-readable storage medium 504 may be analogous to instructions 306 and 308 on machine-readable storage medium 304. Instructions 510 may write, during a precharge cycle that is executed in response to a precharge command received, during a PPR on a memory device, with a read command directed at a memory unit on the memory device, data to a repair unit instead of writing data back to the memory unit. The PPR may include replacing the memory unit with the repair unit.

Instructions 512 may use on-die ECC on the memory device to correct, during the precharge cycle, errors in the memory unit. For example, the on-die ECC may correct single-bit errors. The data written to the repair unit may thus be a corrected version of the data in the memory unit (or at least a version that has fewer errors than what is in the memory unit).

Instructions 514 may transmit data, that the on-die ECC is unable to correct, to a memory controller. For example, the on-die ECC may not be able to correct two-bit errors (although the on-die ECC may be able to detect such errors). ECC on the memory controller may be used to correct errors in the transmitted data.

Instructions 516 may write, in response to a write command that is directed at the memory unit and issued during the PPR, data associated with the write command to the repair unit. By writing such data to the repair unit, write commands directed at the memory unit may be executed during the PPR, decreasing the likelihood of OS/application timeouts. In addition, the repair unit may contain the proper data at the end of the PPR.

Figure 6:
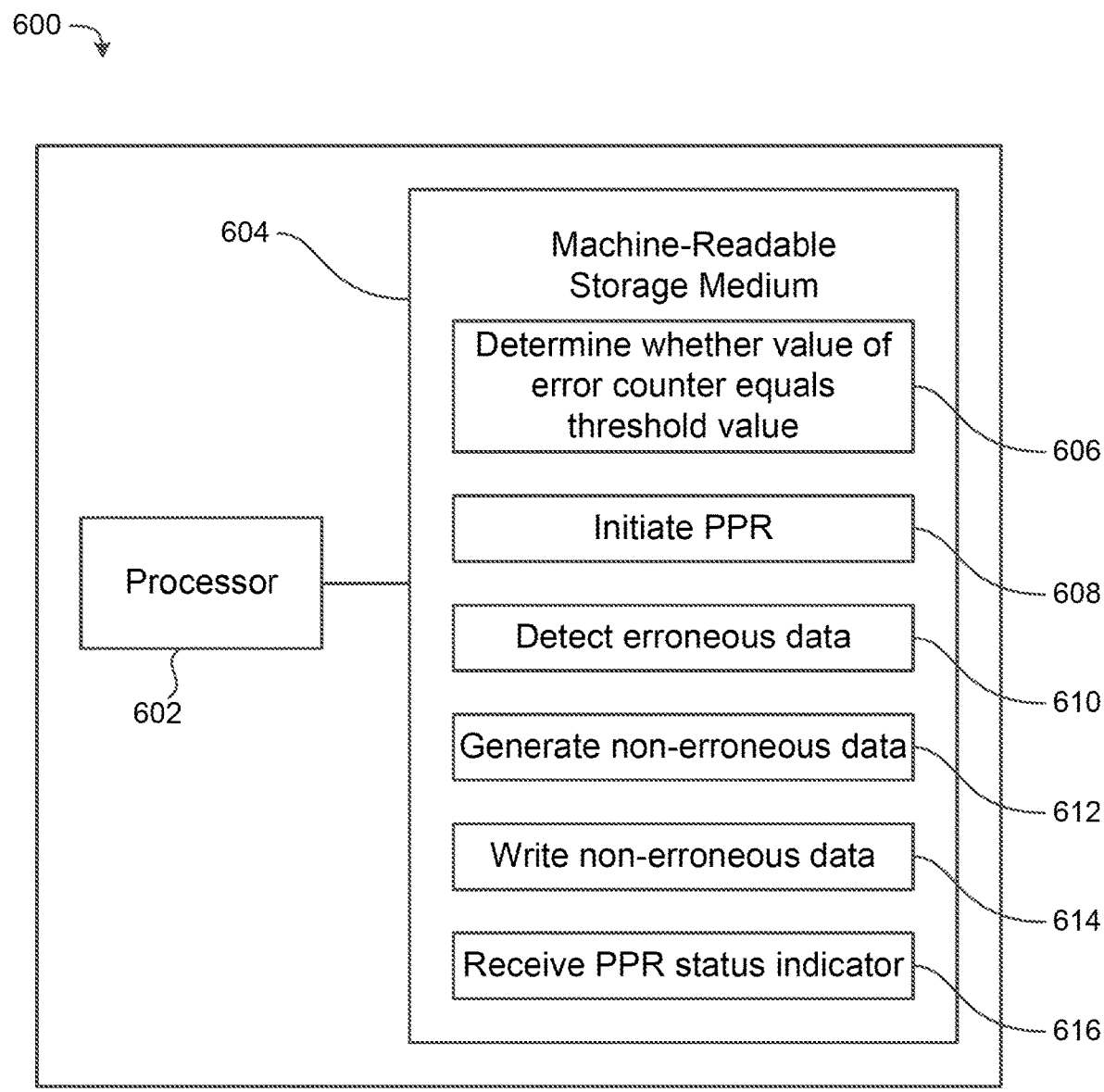
FIG. 6 is a block diagram of an example device that includes a machine-readable storage medium encoded with instructions to enable storage of non-erroneous data in a repair unit during a PPR.

FIG. 6 is a block diagram of an example device 600 that includes e-readable storage medium encoded with instructions to enable storage of non-erroneous data in a repair unit during a PPR. Device 600 may be a memory controller. In some implementations, device 600 may be part of an electronic user device, such as a notebook computer, a desktop computer, a workstation, a tablet computing device, a mobile phone, or an electronic book reader. In some implementations, device 600 may be part of a server. In FIG. 6, device 600 includes processor 602 and machine-readable storage medium 604.

As with processor 302 of FIG. 3, processor 602 may include a CPU, microprocessor (e.g., semiconductor-based microprocessor), and/or other hardware device suitable for retrieval and/or execution of instructions stored in machine-readable storage medium 604. Processor 602 may fetch, decode, and/or execute instructions 606, 608, 610, 612, 614, and 616 to enable storage of non-erroneous data in a repair unit during a PPR, as described below. As an alternative or in addition to retrieving and/or executing instructions, processor 602 may include an electronic circuit comprising a number of electronic components for performing the functionality of instructions 606, 608, 610, 612, 614, and/or 616.

As with machine-readable storage medium 304 of FIG. 3, machine-readable storage medium 604 may be any suitable physical storage device that stores executable instructions. Instructions 606 and 608 on machine-readable storage medium 604 may be analogous to instructions 306 and 308 on machine-readable storage medium 304. Instructions 610 may detect, during a PPR on a memory device, erroneous data that is read from a memory unit on the memory device. The erroneous data may be detected using ECC on a memory controller. The PPR may include replacing the memory unit with a repair unit.

Instructions 612 may generate non-erroneous data by correcting the erroneous data for example, ECC on a memory controller may be used to correct the erroneous data. Instructions 614 may write the non-erroneous data to the repair unit. In some implementations, a scrubber on a memory controller may write the non-erroneous data to the repair unit.

Instructions 616 may receive a PPR status indicator from the memory device. The PPR may be initiated if the received PPR status indicator indicates PPR availability on the memory device. The PPR may not be initiated if the received PPR status indicator indicates that a PPR is in progress or is unavailable (e.g., a PPR may be unavailable if a repair unit is not available).

Figure 7:
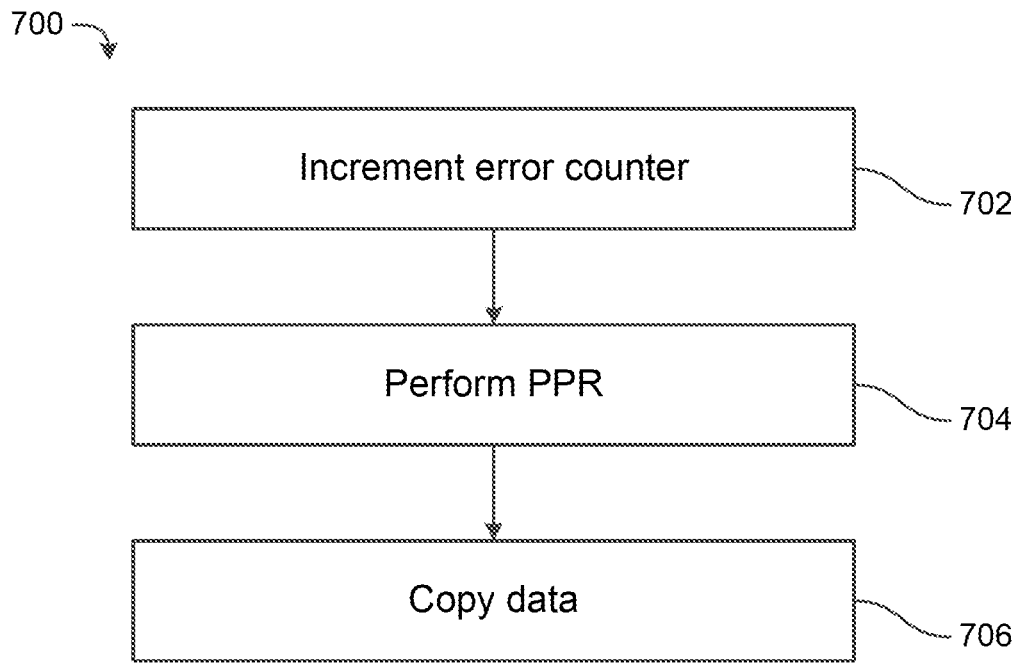
FIG. 7 is a flowchart of an example method for on-die error tracking.
Figure 8:
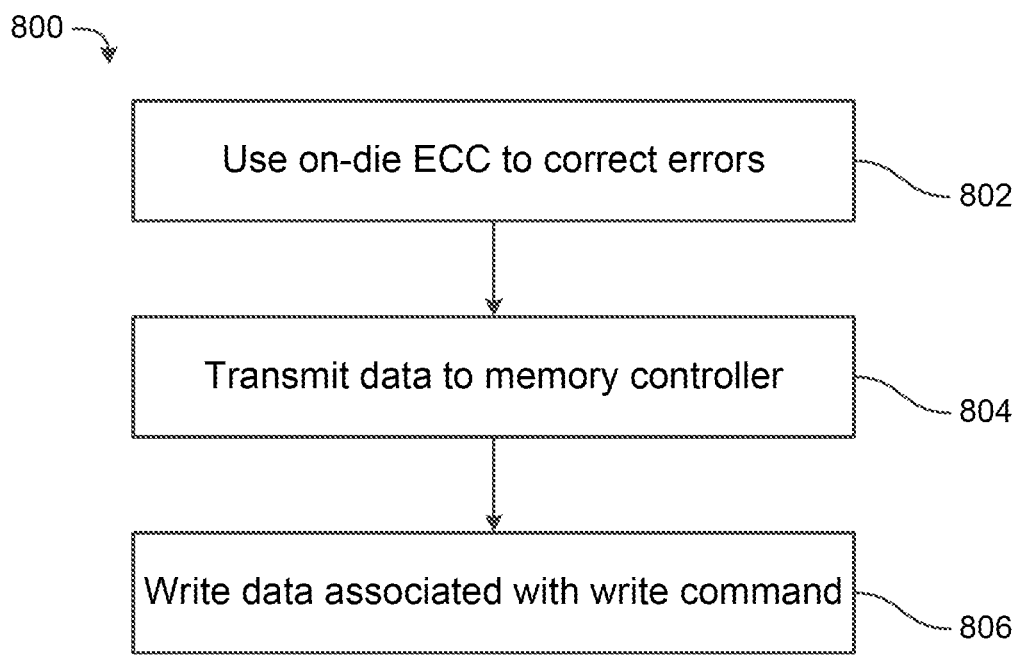
FIG. 8 is a flowchart of an example method for correcting errors during a PPR.

Methods related to initiating PPR in response to on-die error counters reaching certain values are discussed with respect to FIGS. 7-8. FIG. 7 is a flowchart of an example method 700 for on-die error tracking. Although execution of method 700 is described below with reference to processor 302 of FIG. 3, it should be understood that execution of method 700 may be performed by other suitable devices, such as processor 502 of FIG. 5. Method 700 may be implemented in the form of executable instructions stored on a machine-readable storage medium and/or in the form of electronic circuitry.

Method 700 may start in block 702, where processor 302 may increment, in response to detection of an error in one of a plurality of memory units on a memory device, an error counter on the memory device. The error may be detected by on-die ECC on the memory device. The error counter may be associated with the one of the plurality of memory units.

In block 704, processor 302 may perform, in response to a determination that a value of the error counter equals a threshold value, a PPR on the memory device. The PPR may be initiated by the memory device or by a memory controller, as discussed above with respect to FIG. 3.

In block 706, processor 302 may copy, during the PPR, data in the one of the plurality of memory units to a repair unit. The PPR may include replacing the one of the plurality of memory units with the repair unit. In some implementations, the copying may include writing, during a precharge cycle that is executed in response to a precharge command received, during the PPR, with a read command directed at the one of the plurality of memory units, data to the repair unit instead of writing data back to the one of the plurality of memory units.

FIG. 8 is a flowchart of an example method 800 for correcting errors during a PPR. Although execution of method 800 is described below with reference to processor 502 of FIG. 5, it should be understood that execution of method 800 may be performed by other suitable devices, such as processor 302 of FIG. 3. Some blocks, of method 800 may be performed in parallel with and/or after method 700. Method 800 may be implemented in the form of executable instructions stored on a machine-readable storage medium and/or in the form of electronic circuitry.

Method 800 may start in block 802, where processor 502 may use on-die ECC on a memory device to correct, during a precharge cycle, errors in one of a plurality of memory units on the memory device. For example, the on-die ECC may correct single-bit errors. The precharge cycle may occur during a PPR on the memory device. The PPR may include replacing the one of the plurality of memory units with a repair unit.

In block 804, processor 502 may transmit data, that the on-die ECC is unable to correct, to a memory controller. For example, the on-die ECC may not be able to correct two-bit errors (although the on-die ECC may be able to detect such errors). ECC on the memory controller may be used to correct errors in the transmitted data.

In block 806, processor 502 may write, during the PPR, data associated with a write command, that is issued during the PPR and directed to the one of the plurality of memory units, to the repair unit. By writing such data to the repair unit, write commands directed at the memory unit may be executed during the PPR, decreasing the likelihood of OS/application timeouts. In addition, the repair unit may contain the proper data at the end of the PPR.

The foregoing disclosure describes on-die tracking of errors detected by on-die ECC. Example implementations described herein enable more efficient use of memory controller and memory module resources, as well as reduction of OS and application timeouts.

We claim:

1. A machine-readable storage medium encoded with instructions executable by a processor, the machine-readable storage medium comprising:
   instructions to determine whether a value of one of a plurality of error counters on a memory device equals a threshold value, wherein:
      the memory device comprises on-die error-correcting code (ECC);
   the one of the plurality of error counters is associated with a memory unit on the memory device; and
   the one of the plurality of error counters is to be incremented in response to an error being detected, by the on-die ECC, in the memory unit; and
   instructions to initiate, in response to a determination that the value of the one of the plurality of error counters equals the threshold value, a post package repair (PPR), wherein the PPR comprises replacing the memory unit with a repair unit.

2. The machine-readable storage medium of claim 1, further comprising:
   instructions to suspend functionality of the on-die ECC during the PPR;
   instructions to copy, during the PPR, data in the memory unit to a buffer on the memory device;
   instructions to flush, after the PPR has been completed, data in the buffer to a memory controller, wherein the memory controller is to generate non-erroneous data by correcting erroneous data received from the buffer;
   instructions to write the non-erroneous data to the repair unit; and
   instructions to enable, in response to a determination that the write to the repair unit has been completed, functionality of the on-die ECC.

3. The machine-readable storage medium of claim 1, further comprising:
   instructions to write, during a precharge cycle that is executed in response to a precharge command received, during the PPR, with a read command directed at the memory unit, data to the repair unit instead of writing data back to the memory unit;
   instructions to use the on-die ECC to correct, during the precharge cycle, errors in the memory unit; and
   instructions to transmit data, that the on-die ECC is unable to correct, to a memory controller.

4. The machine-readable storage medium of claim 1, further comprising instructions to write, in response to a write command that is directed at the memory unit and issued during the PPR, data associated with the write command to the repair unit.

5. The machine-readable storage medium of claim 1, further comprising:
   instructions to detect, during the PPR, erroneous data that is read from the memory unit;

instructions to generate non-erroneous data by correcting the erroneous data; and instructions to write the non-erroneous data to the repair unit.

6. The machine-readable storage medium of claim 1, further comprising instructions to receive a PPR status indicator from the memory device, wherein the PPR is initiated if the received PPR status indicator indicates PPR availability on the memory device.

7. A method comprising:

incrementing, in response to detection of an error in one of a plurality of memory units on a memory device, an error counter on the memory device, wherein:

the error is detected by on-die error-correcting code (ECC) on the memory device; and the error counter is associated with the one of the plurality of memory units;

performing, in response to a determination that a value of the error counter exceeds a threshold value, a post package repair (PPR) on the memory device; and copying, during the PPR, data in the one of the plurality of memory units to a repair unit.

8. The method of claim 7, wherein the copying comprises writing, during a precharge cycle that is executed in response to a precharge command received, during the PPR, with a read command directed at the one of the plurality of memory units, data to the repair unit instead of writing data back to the one of the plurality of memory units.

9. The method of claim 8, further comprising:

using the on-die ECC to correct, during the precharge cycle, errors in the one of the plurality of memory units; and transmitting data, that the on-die ECC is unable to correct, to a memory controller.

10. The method of claim 7, further comprising writing, during the PPR, data associated with a write command, that is issued during the PPR and directed to the one of the plurality of memory units, to the repair unit.

11. The machine-readable storage medium of claim 1, wherein the repair unit comprises a redundant group of memory elements.

12. The method of claim 7, wherein the repair unit comprises a redundant group of memory elements.

* * * * *